(12) United States Patent
Miller

(10) Patent No.: US 6,445,066 B1
(45) Date of Patent: Sep. 3, 2002

(54) SPLITTING AND ASSIGNING POWER PLANES

(75) Inventor: Leah M. Miller, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/885,491

(22) Filed: Jun. 20, 2001

(51) Int. Cl.$^7$ .......................... H01L 23/52; H01L 21/82; H01L 21/44; H01L 21/4763
(52) U.S. Cl. ....................... 257/691; 438/129; 438/599; 438/618; 438/666
(58) Field of Search ........................ 257/691; 438/129, 438/599, 618, 666

(56) References Cited

U.S. PATENT DOCUMENTS

| | | | | |
|---|---|---|---|---|
| 4,551,746 A | * | 11/1985 | Gilbert et al. | 257/691 |
| 6,396,137 B1 | * | 5/2002 | Klughart | 257/691 |
| 2002/0066951 | * | 12/2000 | Li et al. | 257/691 |

* cited by examiner

*Primary Examiner*—David E. Graybill
(74) *Attorney, Agent, or Firm*—Luedeka, Neely & Graham

(57) ABSTRACT

A method for assigning signal traces to one of a plurality of power planes on a power layer of an integrated circuit package. The integrated circuit package has an integrated circuit signal contact region, a top routing layer, and a bottom routing layer. The power layer underlies both the top routing layer and the bottom routing layer. First signal traces on the bottom routing layer are routed from contacts disposed in a core portion of the integrated circuit signal contact region to first ball contacts disposed within a first perimeter of the integrated circuit package. The first perimeter has dimension corresponding to a first distance from the integrated circuit signal contact region. Second signal traces on the top routing layer are routed from contacts disposed in a peripheral portion of the integrated circuit signal contact region to second ball contacts. The second ball contacts are disposed outside of the first perimeter of the integrated circuit package and within a second perimeter of the integrated circuit package. The second perimeter has dimensions corresponding to a second distance from the integrated circuit signal contact region, where the second distance is greater than the first distance. The power layer is segmented into the plurality of power planes. At least a first power plane of the plurality of power planes is bounded within the first perimeter. The first power plane is configured to carry a first voltage corresponding to the first signal traces. The first ball contacts are in proximity to the first power plane. At least a second power plane of the plurality of power planes is bounded between the first perimeter and the second perimeter. The second power plan is configured to carry a second voltage corresponding to the second signal traces. The second ball contacts are in proximity to the second power plane.

7 Claims, 1 Drawing Sheet

SPLITTING AND ASSIGNING POWER PLANES

FIELD

This invention relates to the field of integrated circuit packaging. More particularly the invention relates to associating signal traces and ball contacts with multiple power planes on a power layer of an integrated circuit package.

BACKGROUND

Modern integrated circuits typically require a variety of different voltages. For example, some of the components of an integrated circuit may require five volts, while others of the components may require three volts, or some other voltage.

Traditionally, a separate power layer of an integrated circuit package is provided for each of the different voltages required by the integrated circuit. However, this approach is undesirable, as it results in an increased number of layers. These additional layers tend to add cost to the package in terms of both the cost of materials for each package and the cost of the tooling required to fabricate the packages.

Splitting a single power layer into wedge-shaped power planes that carry different voltages has been used in packages that are customized for specific integrated circuits that have only peripheral contacts. These customized packages tend to have materials and tooling costs that are lower in comparison to those of packages with multiple power layers, but tend to cost more than the multiple power layer packages in terms of longer cycle times to develop a customized package for each different integrated circuit, and the cost to provide a greater number of customized packages, rather than a few generic packages that can accommodate many different integrated circuits.

Further, these wedge-shaped power planes are not altogether satisfactory when applied to packages for integrated circuits that have both peripheral contacts and core contacts. When signal routing initiates from deeper within the integrated circuit, the wedge-shaped power planes become very narrow and less effective in electrically isolating the associated signal traces from cross talk and other signal interference.

What is needed, therefore, is an improvement wherein multiple power planes are incorporated on a single layer of an integrated circuit package for integrated circuits that have both peripheral contacts and core contacts.

SUMMARY

The above and other needs are met by a method for assigning signal traces to one of a plurality of power planes on a power layer of an integrated circuit package. The integrated circuit package has an integrated circuit signal contact region, a top routing layer, and a bottom routing layer. The power layer underlies both the top routing layer and the bottom routing layer.

First signal traces on the bottom routing layer are routed from contacts disposed in a core portion of the integrated circuit signal contact region to first ball contacts disposed within a first perimeter of the integrated circuit package. The first perimeter has dimension corresponding to a first distance from the integrated circuit signal contact region.

Second signal traces on the top routing layer are routed from contacts disposed in a peripheral portion of the integrated circuit signal contact region to second ball contacts. The second ball contacts are disposed outside of the first perimeter of the integrated circuit package and within a second perimeter of the integrated circuit package. The second perimeter has dimensions corresponding to a second distance from the integrated circuit signal contact region, where the second distance is greater than the first distance.

The power layer is segmented into the plurality of power planes. At least a first power plane of the plurality of power planes is bounded within the first perimeter. The first power plane is configured to carry a first voltage corresponding to the first signal traces. The first ball contacts are in proximity to the first power plane.

At least a second power plane of the plurality of power planes is bounded between the first perimeter and the second perimeter. The second power plane is configured to carry a second voltage corresponding to the second signal traces. The second ball contacts are in proximity to the second power plane.

Thus, the method as described above produces a package with correct referencing of both the signal traces and the ball contacts that are associated with a given voltage of a given power plane. Assignments are made so that signal nets routed on the lowest layer in the package are assigned to the ball contacts nearest the center of the package. This allows those signal traces on the layer directly above the bottom routing layer to remain referenced to that interior power plane for their entire length. Each subsequent routing layer is assigned to ball contacts in the next nearest region of the power layer, until finally the uppermost routing layer is assigned to ball contacts at the package edge. The power layer is split into rings in such a way that it provides appropriate referencing for the ball contacts in outer portions of the package, without causing interference with unassociated signal traces on the routing layer directly above it. In a preferred embodiment, these rings can then be further split into wedges to form multiple power planes within a single ring on the power layer, in order to match the splits of the power planes adjacent to the signal routing layers.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
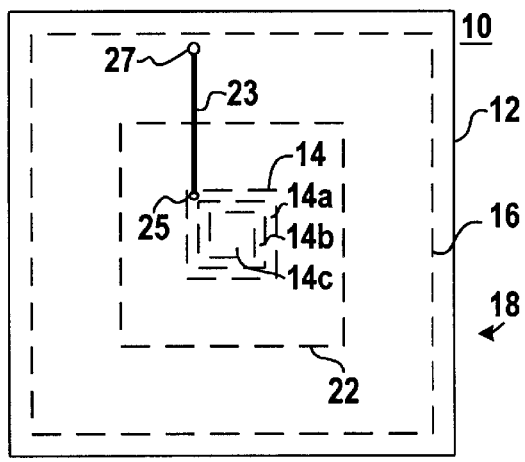
FIG. 1 is a top plan view of a top routing layer of an integrated circuit package in accordance with a preferred embodiment of the invention.

Referring now to FIG. 1 there is depicted a top routing layer 18 of an integrated circuit package 10 having a substrate 12 and an integrated circuit signal contact region 14. It is appreciated that there may be layers above the top routing layer 18 of the integrated circuit package 10. However, these overlying layers are preferably not routing layers as described herein, but rather may be ground plane layers or power plane layers or protective layers. Thus, the top routing layer 18 is so designated herein because it is preferably the topmost routing layer within the integrated circuit package 10, or in other words, is the routing layer that is closest to the integrated circuit.

The integrated circuit signal contact region 14 designates a portion of the integrated circuit package 10 that receives the integrated circuit. It is appreciated that the integrated circuit package 10 only physically contacts the integrated circuit on a single layer, such as on the top routing layer 18. However, as various aspects of the invention as disclosed herein are best described in reference to the location of the integrated circuit signal contact region 14, the integrated circuit signal contact region 14 is also depicted on the other layers of the integrated circuit package described herein.

The integrated circuit signal contact region 14 contains a plurality of signal contacts, which function to establish electrical connections between the integrated circuit to be packaged, and the integrated circuit package 10, and which conduct electrical signals between the integrated circuit and the integrated circuit package 10. It is understood that the integrated circuit signal contact region 14 also includes power contacts and ground contacts. In general, the power contacts provide power to the integrated circuit from one or more power layers of the integrated circuit package 10. The ground contacts provide a ground from one or more ground layers of the integrated circuit package 10.

The electrical connections between the packaged integrated circuit and the integrated circuit package 10 are preferably made by an array of solder elements, called solder balls. The solder balls are placed between matching pairs of electrically conductive contact pads on each of the packaged integrated circuit and the integrated circuit package 10. Electrical signals then flow from one set of contact pads through the solder balls to the other set of contact pads, typically in both directions.

It is understood that electrically conductive vias, electrically conductive links, and electrically conductive traces are present on the top routing layer 18. The links connect the power, ground, and signal contacts to their associated vias, which provide electrical continuity through the layers of the integrated circuit package 10. The traces route the signals from the signal contacts to other portions of the integrated circuit package 10, from where they can be further electrically communicated to other elements of a larger circuit.

The traces on the top routing layer 18 of the integrated circuit package 10, such as trace 23, preferably connect a signal contact 25 disposed within a peripheral portion 14a of the integrated circuit signal contact region 14 to a first ball contact 27 disposed in a portion of the top routing layer 18 disposed between a first perimeter 22 and a second perimeter 16. For the sake of clarity in the figures and understanding of the description, only a single first ball contact 27, signal trace 23, and signal contact 25 in the peripheral portion 14a of the integrated circuit signal contact region 14 are depicted. However, it is appreciated that in actual implementation, there may be hundreds of such sets of ball contacts 27, signal traces 23, and signal contacts 25.

Figure 2:
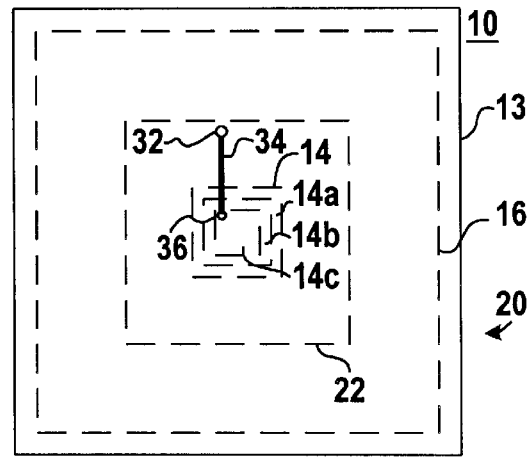
FIG. 2 is a top plan view of a bottom routing layer of the integrated circuit package in accordance with a preferred embodiment of the invention.

Turning now to FIG. 2, there is shown a bottom routing layer 20. In a preferred embodiment, the bottom routing layer 20 represents a lowermost routing layer of the integrated circuit package 10. In other words, there may be intervening layers between the top routing layer 18 of the integrated circuit package 10 and the bottom routing layer 20 of the integrated circuit package 10, which layers may be additional routing layers or ground layers or power layers. However, there are no routing layers disposed farther from the top routing layer 18 than the bottom routing layer 20.

However, there may be other layers, that are not routing layers, beneath the bottom routing layer 20. In fact, according to the preferred embodiment of the present invention, the power layer is disposed beneath the bottom routing layer 20, as described in more detail below.

Figure 3:
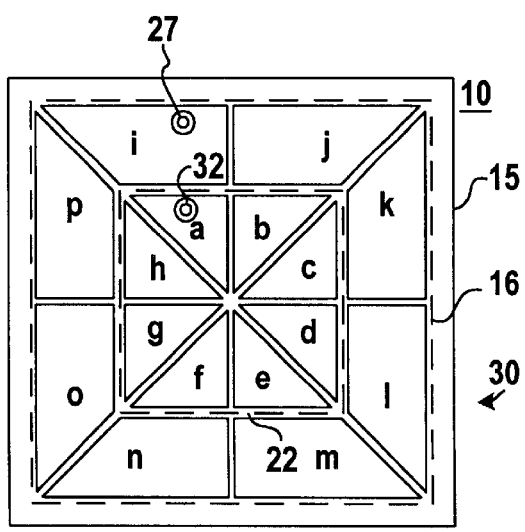
FIG. 3 is a top plan view of a power layer of the integrated circuit package in accordance with a preferred embodiment of the invention.

It is noted that all of the traces of the bottom routing layer 20 are preferably located within a first perimeter 22. The first perimeter 22 is different from the second perimeter 16, as represented in FIGS. 2 and 3. In a preferred embodiment, the bottom routing layer 20 is preferably an interior routing layer and the first perimeter 22 is smaller than the second perimeter 16.

The integrated circuit signal contact region 14 is depicted on the bottom routing layer 20, even though the contacts of the integrated circuit signal contact region 14 are not physically disposed on the bottom routing layer 20. However, there are electrical contacts disposed within this general region on the bottom routing layer 20, which electrical contacts are electrically connected to the contacts within the integrated circuit signal contact region 14 on the top routing layer 18. These electrical contacts on the bottom routing layer 20 are electrically connected to the contacts on the top routing layer 18 such as by electrically conductive vias that route down through the top routing layer 18 and any layers intervening between the top routing layer 18 and the bottom routing layer 20.

Thus, it is expedient to refer to electrical contacts on the bottom routing layer 20 that underlie that integrated circuit signal contact region 14 on the top routing layer 18 as also being within the integrated circuit signal contact region 14. It is understood that when referred to in this manner, the electrical connections required to connect the top routing layer 18 to the bottom routing layer 20 are implied.

The traces on the bottom routing layer 20 of the integrated circuit package 10, such as trace 34, preferably connect a signal contact 36 disposed within a core portion 14c of the integrated circuit signal contact region 14 to a second ball contact 32 disposed in a portion of the bottom routing layer 20 disposed within the first perimeter 22. For the sake of clarity in the figures and understanding of the description, only a single second ball contact 32, signal trace 34, and signal contact 36 in the core portion 14c of the integrated circuit signal contact region 14 are depicted. However, it is appreciated that in actual implementation, there may be hundreds of such sets of ball contacts 32, signal traces 34, and signal contacts 36.

Turning now to FIG. 3, there is shown a preferred embodiment of a power layer 30 of the integrated circuit package 10. The power layer 30 is preferably disposed beneath the lowermost routing layer, which in the embodiment described above is the bottom routing layer 20. The power layer 30 preferably includes a first plurality of selectively electrically independent power planes a–h disposed within an area bounded on the outside by the first perimeter 22, and a second plurality of selectively electrically independent power planes i–p located within an area disposed between the first perimeter 22 and the second perimeter 16.

All of the first traces 34 of the bottom routing layer 20 are preferably each electrically connected to one of the first ball contacts 32 disposed within one of the power planes a–h of the first plurality of power planes within the first perimeter 22, and all of the second traces 23 of the top routing layer 18 are preferably each electrically connected to one of the second ball contacts 27 disposed within one of the power planes i–p of the second plurality of power planes disposed between the first perimeter 22 and the second perimeter 16.

As shown, the power planes a–p represent a total of sixteen selectively electrically independent power planes, all disposed on the power layer 30. In this regard, it is appreciated that each of the power planes a–p could be larger or smaller, or further or less subdivided, such that the total number of power planes could be greater or less than sixteen. This may be accomplished by either creating a greater or lesser number of wedges, or a greater or lesser number of rings, such as defined by the first perimeter 22 and the second perimeter 16. It is appreciated that not every ring defined by the various perimeters that may be used needs to have the same number of wedge-shaped power planes. It is also appreciated that the power planes within a ring need not be wedge-shaped.

In describing the power planes a–p as selectively electrically independent, it is meant that each of the power planes a–p may carry a different voltage potential. Thus, in the embodiment depicted, a total of sixteen different voltage potentials may be carried on the sixteen different power planes a–p. It is appreciated that in an embodiment where a different number of power planes a–p are segmented, then a different total number of voltage potentials may be carried on the power planes. Further, the power planes a–p need not each carry a different voltage potential. Although it would tend to not fully use the capacity of the embodiment of the invention as described herein, all of the power planes a–p could be configured to carry the same voltage potential. In a similar vein, different ones of the power planes a–p could be configured to carry a first given voltage potential, which others of the power planes a–p could be configured to carry a second, third, or fourth given voltage potential, and so forth.

In this manner, the selectively electrically independent power planes a–p provide for a high degree of configurability in the integrated circuit package 10, which allows the integrated circuit package 10 to be adapted to receive any one of many different integrated circuit types, rather than being unalterably customized for a single integrated circuit type. For example, the integrated circuit package 10 can be adapted to receive integrated circuits that require from one to sixteen different voltages.

The integrated circuit package 10 as described above also provides other advantages. It is preferred that a signal trace, such as those depicted on the second routing layer 18 and the first routing layer 20, overlie a power plane that carries the same voltage as that used on the signal trace in question, and also connect to a ball contact that is in proximity to a power plane that carries the same voltage as that used on the signal trace in question. By segmenting the power layer 30 between the perimeters 16 and 22 as described above, those signal traces that route out to ball contacts disposed within the different perimeters can substantially overlie a configurable power plane that carries the same voltage potential as the signal trace.

Further, the ball contacts to which the signal traces connect may selectively be disposed on the same layer as the power layer. In this manner, a ball contact connected to a signal trace operating at a given voltage potential is surrounded by a power plane carrying the same voltage potential as the ball contact. By providing a power plane with a voltage that matches that as used in proximate ball contacts and signal traces, electrical distortions, such as cross talk, to the signals carried on the ball contacts and signal traces tend to be reduced.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for assigning signal traces to one of a plurality of power planes on a power layer of an integrated circuit package, the integrated circuit package having an integrated circuit signal contact region, a top routing layer and a bottom routing layer, the power layer underlying both the top routing layer and the bottom routing layer, the method comprising the steps of:

routing first signal traces on the bottom routing layer from contacts disposed in a core portion of the integrated circuit signal contact region to first ball contacts disposed within a first perimeter of the integrated circuit package, where the first perimeter has dimensions corresponding to a first distance from the integrated circuit signal contact region, routing second signal traces on the top routing layer from contacts disposed in a peripheral portion of the integrated circuit signal contact region to second ball contacts disposed outside of the first perimeter of the integrated circuit package and within a second perimeter of the integrated circuit package, where the second perimeter has dimensions corresponding to a second distance from the integrated circuit signal contact region, where the second distance is greater than the first distance, segmenting the power layer into the plurality of power planes, where at least a first power plane of the plurality of power planes is bounded within the first perimeter, and the first power plane is configured to carry a first voltage corresponding to the first signal traces, and the first ball contacts are in proximity to the first power plane, and where at least a second power plane of the plurality of power planes is bounded between the first perimeter and the second perimeter, and the second power plane is configured to carry a second voltage corresponding to the second signal traces, and the second ball contacts are in proximity to the second power plane.

2. The method of claim 1, wherein the integrated circuit package has an intervening routing layer disposed between the top routing layer and the bottom routing layer, the method further comprising the steps of:

routing third signal traces on the intervening routing layer from contacts disposed in an intervening portion of the integrated circuit signal contact region disposed between the core portion of the integrated circuit signal contact region and the peripheral portion of the integrated circuit signal contact region to third ball contacts disposed outside of the first perimeter of the integrated circuit package and within a third perimeter of the integrated circuit package, where the third perimeter has dimensions corresponding to a third distance from the integrated circuit signal contact region, where the third distance is greater than the first distance and the smaller than the second distance, and segmenting the power layer into the plurality of power planes, where at least a third power plane of the plurality of power planes is bounded by the first perimeter and the third perimeter, and the third power plane is configured to carry a third voltage corresponding to the third signal traces, and the third ball contacts underlie the third power plane.

3. The method of claim 1, wherein the plurality of power planes comprises sixteen power planes.

4. The method of claim 1, wherein the first power plane is radially segmented into four power planes.

5. The method of claim 1, wherein the second power plane is radially segmented into four power planes.

6. An integrated circuit package, comprising:

an integrated circuit signal contact region, having contacts disposed in a core portion of the integrated circuit signal contact region and contacts disposed in a peripheral portion of the integrated circuit signal contact region, a bottom routing layer having first signal traces connected to the contacts disposed in the core portion of the integrated circuit signal contact region at one end and to first ball contacts disposed within a first perimeter of the integrated circuit package on another end, where the first perimeter has dimensions corresponding to a first distance from the integrated circuit signal contact region, a top routing layer overlying the bottom routing layer, the top routing layer having second signal traces connected to the contacts disposed in the peripheral portion of the integrated circuit signal contact region at one end and to second ball contacts disposed outside of the first perimeter of the integrated circuit package and within a second perimeter of the integrated circuit package on another end, where the second perimeter has dimensions corresponding to a second distance from the integrated circuit signal contact region, and the second distance is greater than the first distance, and a power layer underlying both the top routing layer and the bottom routing layer, the power layer having, a first power plane bounded within the first perimeter, the first power plane configured to carry a first voltage corresponding to the first signal traces, where the first ball contacts are in proximity to the first power plane, and a second power plane bounded between the first perimeter and the second perimeter, the second power plane configured to carry a second voltage corresponding to the second signal traces, where the second ball contacts are in proximity to the second power plane.

7. The package of claim 6, wherein the power layer comprises sixteen power planes.

* * * * *